(12) United States Patent (10) Patent No.: US 10,147,813 B2
Huang (45) Date of Patent: Dec. 4, 2018

(54) TUNNELING FIELD EFFECT TRANSISTOR

(71) Applicant: United Silicon Carbide, Inc., Monmouth Junction, NJ (US)

(72) Inventor: Xing Huang, Ewing, NJ (US)

(73) Assignee: United Silicon Carbide, Inc., Monmouth Junction, NJ (US)

( * ) Notice: Subject to any disclaimer, the term of this patent is extended or adjusted under 35 U.S.C. 154(b) by 0 days.

(21) Appl. No.: 15/449,196

(22) Filed: Mar. 3, 2017

(65) Prior Publication Data
US 2017/0256642 A1 Sep. 7, 2017

Related U.S. Application Data

(60) Provisional application No. 62/303,623, filed on Mar. 4, 2016.

(51) Int. Cl.
*H01L 29/15* (2006.01)
*H01L 31/0312* (2006.01)
(Continued)

(52) U.S. Cl.
CPC ...... *H01L 29/7813* (2013.01); *H01L 29/0834* (2013.01); *H01L 29/1602* (2013.01); *H01L 29/1608* (2013.01); *H01L 29/2003* (2013.01); *H01L 29/24* (2013.01); *H01L 29/4236* (2013.01); *H01L 29/66356* (2013.01); *H01L 29/66734* (2013.01); *H01L 29/7391* (2013.01);
(Continued)

(58) Field of Classification Search
CPC ........... H01L 29/7813; H01L 29/66734; H01L 29/7802; H01L 29/24; H01L 29/1602; H01L 29/1608; H01L 29/2003
See application file for complete search history.

(56) References Cited

U.S. PATENT DOCUMENTS 5,877,515 A   3/1999  Ajit
6,653,550 B2 * 11/2003  Hayashi ............... H01L 31/076
                                                          136/244
(Continued)

OTHER PUBLICATIONS

Hoshi et al., "Novel SiC Power Devices utilizing a Si/4H—SiC Heterojunction", Nissan Research Center, Nissan Motor Co., Ltd., 2007, 373-376.
(Continued)

*Primary Examiner* — Ismail Muse
(74) *Attorney, Agent, or Firm* — Baker & Hostetler LLP

(57) ABSTRACT

A tunneling field-effect transistor with an insulated planar gate adjacent to a heterojunction between wide-bandgap semiconductor, such as silicon carbide, and either a narrow band gap material or a high work function metal. The heterojunction may be formed by filling a recess on a silicon carbide planar substrate, for example by etched into an epitaxially grown drift region atop the planar substrate. The low band gap material may be silicon which is deposited heterogeneously and, optionally, annealed via laser treatment and/or doped. The high work function metal may be tungsten, platinum, titanium, nickel, tantalum, or gold, or an alloy containing such a metal. The plane of the gate may be lateral or vertical. A blocking region of opposite doping type from the drift prevents conduction from the filled recess to the drift other than the conduction though the heterojunction.

21 Claims, 27 Drawing Sheets

(51) Int. Cl.
H01L 29/78 (2006.01)
H01L 29/16 (2006.01)
H01L 29/20 (2006.01)
H01L 29/24 (2006.01)
H01L 29/66 (2006.01)
H01L 29/739 (2006.01)
H01L 29/423 (2006.01)
H01L 29/08 (2006.01)

(52) U.S. Cl.
CPC ...... *H01L 29/7802* (2013.01); *H01L 29/7828* (2013.01)

(56) References Cited

U.S. PATENT DOCUMENTS

| | | | |
|---|---|---|---|
| 7,714,352 B2 | 5/2010 | Shimoida et al. | |
| 7,728,336 B2* | 6/2010 | Yatsuo | H01L 29/086 257/77 |
| 7,859,015 B2 | 12/2010 | Shimoida et al. | |
| 9,349,855 B2* | 5/2016 | Kumagai | H01L 29/41766 |
| 9,882,036 B2* | 1/2018 | Kono | H01L 29/45 |
| 9,893,174 B2* | 2/2018 | Chowdhury | H01L 29/4236 |
| 2009/0134456 A1* | 5/2009 | Sugimoto | H01L 29/0649 257/329 |
| 2009/0200575 A1 | 8/2009 | Shimoida et al. | |
| 2010/0038681 A1* | 2/2010 | Sugimoto | H01L 29/0642 257/194 |
| 2011/0084284 A1* | 4/2011 | Zhang | H01L 29/0623 257/77 |
| 2011/0101416 A1* | 5/2011 | Schulze | H01L 29/0834 257/139 |
| 2012/0241766 A1* | 9/2012 | Ohtsuka | C30B 23/02 257/77 |
| 2012/0319127 A1* | 12/2012 | Chowdhury | H01L 29/66204 257/76 |
| 2014/0070079 A1* | 3/2014 | Kurokawa | H01L 27/144 250/214.1 |
| 2014/0131721 A1* | 5/2014 | Nie | H01L 29/66909 257/76 |
| 2014/0299890 A1* | 10/2014 | Matocha | H01L 29/1608 257/77 |
| 2014/0306284 A1* | 10/2014 | Mauder | H01L 29/105 257/330 |
| 2014/0361309 A1* | 12/2014 | Mishra | H01L 29/2003 257/76 |
| 2015/0014699 A1* | 1/2015 | Motonobu | H01L 29/66431 257/76 |
| 2015/0021664 A1* | 1/2015 | Simin | H01L 29/7788 257/192 |
| 2015/0028351 A1* | 1/2015 | Van Brunt | H01L 29/1608 257/77 |
| 2015/0044859 A1* | 2/2015 | Cheng | H01L 27/088 438/478 |
| 2015/0270356 A1* | 9/2015 | Palacios | H01L 21/02458 257/76 |
| 2015/0287777 A1* | 10/2015 | Kumagai | H01L 29/0615 257/77 |
| 2016/0056283 A1* | 2/2016 | Suzuki | H01L 29/7827 257/77 |
| 2016/0087044 A1* | 3/2016 | Iijima | H01L 29/1095 257/77 |
| 2016/0247927 A1* | 8/2016 | Nomura | H01L 29/7869 |
| 2017/0141206 A1* | 5/2017 | Koga | H01L 21/0445 |
| 2017/0207305 A1* | 7/2017 | Yen | H01L 29/0865 |
| 2017/0301783 A1* | 10/2017 | Ebiike | H01L 29/78 |

OTHER PUBLICATIONS

Pérez-Tomás et al. "High doped MBE si p-n and n-n heterojunction diodes on 4H—SiC", Microelectronics Journal, 38(12), Dec. 2007, 1233-1237.

* cited by examiner

Fig. 9
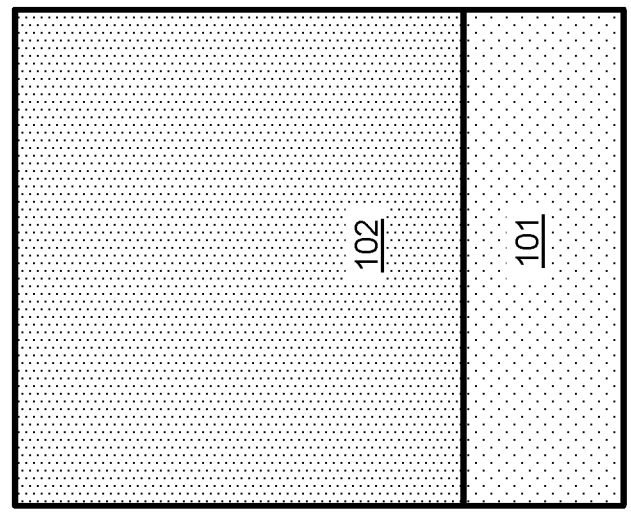
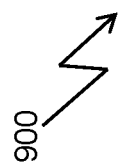

Fig. 10
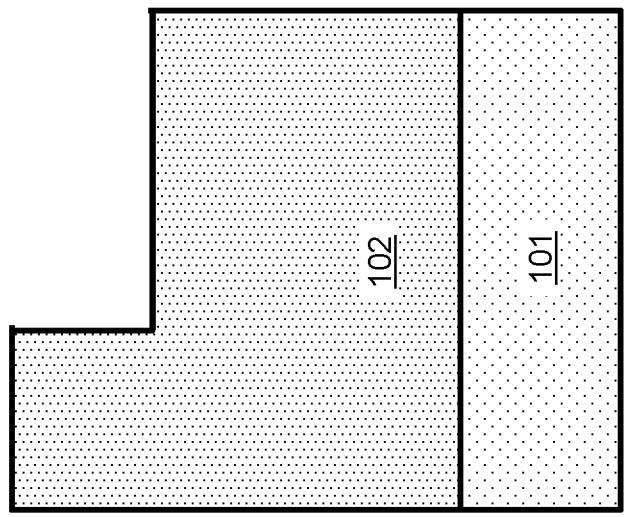
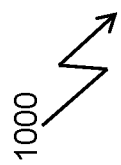

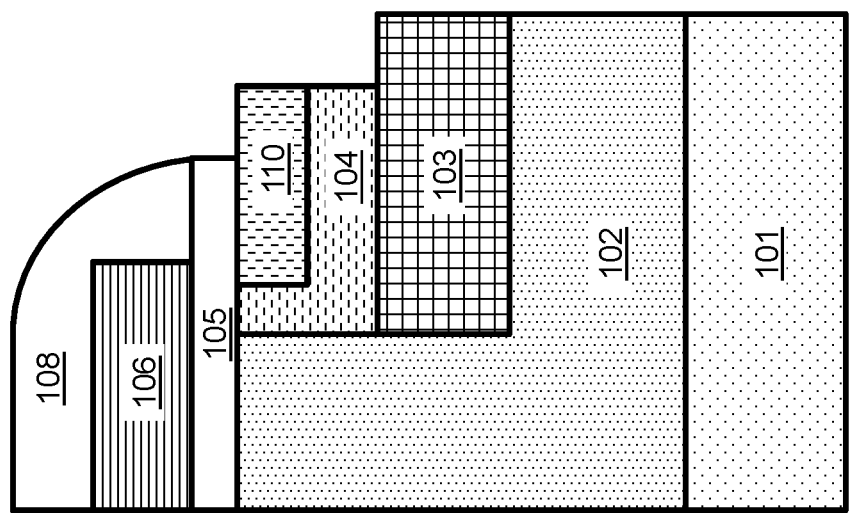
Fig. 18
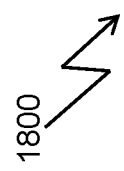
1800

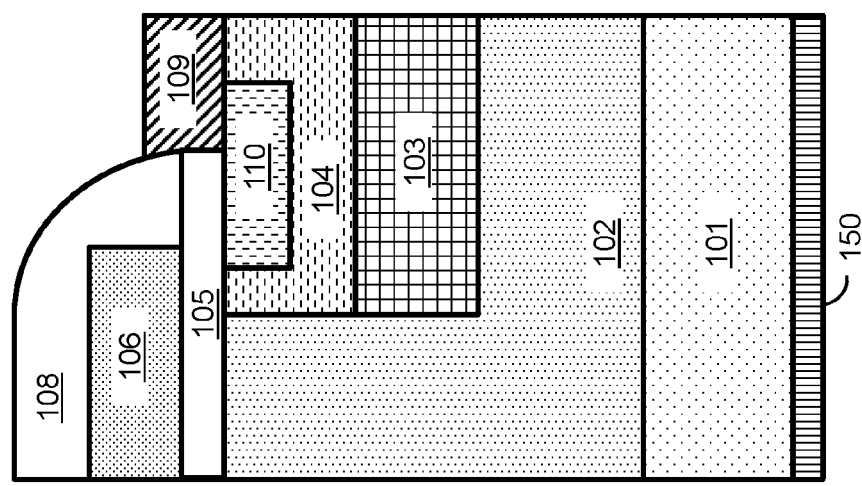
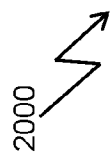
Fig. 20

TUNNELING FIELD EFFECT TRANSISTOR

CROSS REFERENCE TO RELATED APPLICATION

This application claims the benefit of U.S. Provisional Application No. 62/303,623 filed Mar. 4, 2016, titled "Silicon Carbide Tunneling Field Effect Transistor," the disclosure of which is hereby incorporated by reference as if set forth in its entirety.

FIELD OF THE DISCLOSURE

Transistors made from wide-bandgap (WBG) semiconductors are useful in power electronic circuits, such as power factor correction (PFC) circuits, DC-DC converters, DC-AC inverters, and motor drives.

SUMMARY

A tunneling field-effect transistor is made by placing an insulated planar gate adjacent to a heterojunction. The heterojunction may be formed by forming a recess on a wide-bandgap planar substrate and filling the recess with a narrow band gap material or a high work function metal. The recess may be etched into an epitaxially grown drift region atop the planar substrate, for example. The low band gap material may be silicon which is deposited heterogeneously, and may then be annealed via laser treatment and/or doped. The high work function metal may be tungsten, platinum, titanium, nickel, tantalum, or gold, or an alloy containing such a metal, for example. The plane of the gate may be lateral or vertical. A blocking region of opposite doping type from the drift prevents conduction from the filled recess to the drift other than the conduction though the junction.

This summary is provided to introduce a selection of concepts in a simplified form that are further described below in the detailed description. This summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

BRIEF DESCRIPTION OF THE DRAWINGS

A more detailed understanding may be had from the following description, given by way of example in conjunction with the accompanying figures. The figures are not necessarily drawn to scale.

FIGS. 9-20 illustrate an example method for the fabrication process of the TFET of FIG. 1 by showing vertical cross sections of the active cell at various stages of manufacture.

FIG. 9 shows a starting planar substrate.

FIG. 10 shows the planar substrate with a notch or recess.

FIG. 11 shows the planar substrate beneath the recess being implanted.

FIG. 12 shows the recess being filled.

FIG. 13 shows the junction between the recess filling material and the substrate being exposed by planarization.

FIG. 14 shows a portion of the recess filling material being implanted.

FIG. 15 shows the addition of a planar gate dielectric and planar gate electrode.

FIG. 16 shows the addition of an interlayer dielectric.

FIG. 17 shows the opening of a pathway, or via, to the implanted portion of the recess filling material.

FIG. 18 shows the further opening of a via down to the implanted portion of the substrate material.

FIG. 19 shows source metallization connecting to both the implanted portion of the recess filling material and the implanted portion of the substrate.

FIG. 20 shows an alternative configuration for the active cell in which the via and metallization extend only to the recess filling material.

FIG. 21 shows an example edge termination structure wherein guard rings are made using filled recesses and substrate implantations.

FIG. 22 shows an example edge termination structure wherein guard rings are made using substrate implantation only.

FIG. 23 shows an example edge termination structure wherein guard rings are made using a junction termination extension.

DETAILED DESCRIPTION

Figure 1:
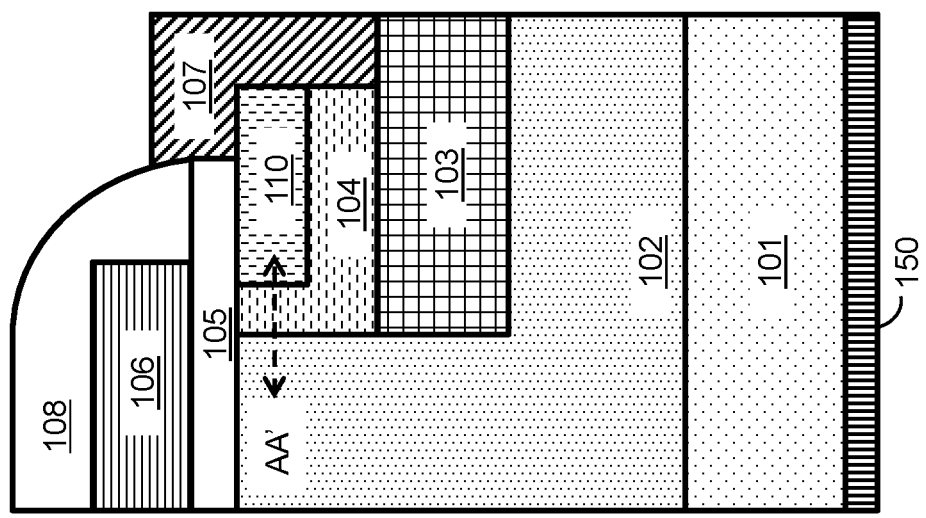
FIG. 1 is vertical cross section of an example lateral planar gate tunneling field effect transistor (TFET) using a low band gap to high band gap semiconductor heterojunction.

A tunneling field-effect transistor is made by placing an insulated planar gate adjacent to a heterojunction. The heterojunction may be formed by filling a recess on a silicon carbide substrate using either a low band gap material or a high work function metal. The recess may be etched into an epitaxially grown drift region atop the substrate.

The low band gap material may be silicon which is deposited heterogeneously. Optionally, the slow band gap material may then be annealed via laser treatment and/or doped. The high work function metal may be tungsten, platinum, titanium, nickel, tantalum, or gold, or an alloy containing such a metal, for example. The plane of the gate may be lateral or vertical. A blocking region of opposite doping type from the drift prevents conduction from the filled recess to the drift other than the conduction though the junction.

Normally-off, insulated-gate transistors offer a number of advantages in many electronic power applications. Silicon carbide (SiC) is an attractive material for making such transistors because, relative to silicon for instance, SiC provides high efficiencies in these applications due to its high breakdown field. However, in devices made with SiC, it may be difficult to achieve the quality of oxide interface seen in silicon devices. This in turn makes it difficult to achieve transistors with the same level of channel resistance and reliability.

Such difficulties may be overcome by using an electron-tunneling transistor with a "zero" channel length. Such a transistor does not require the kinds of inversion layers that are prone to degradation in other devices and exacerbate reliability issues at higher operating temperatures.

Such a device may be realized, for example, by the formation of a heterojunction adjacent to a gate oxide, where the heterojunction is between a low bandgap semiconductor like silicon and SiC. For example, heterogeneous silicon may be deposited in a recess of a silicon carbide wafer. This method may be used to create either horizontal or trench type transistor configurations.

The source area of a SiC TFET may be formed of an amorphous, crystalline, or polycrystalline low band gap material. For example, the material may be initially deposited in a recess of a SiC wafer via chemical vapor deposition (CVD). To achieve larger grain sizes or a substantially single crystal form after deposition, the low band gap material may be annealed, e.g., via laser heating.

Alternatively, a low band gap material in crystalline form may be bonded to the silicon carbide substrate, e.g., by bonding a sheet of silicon crystal to the substrate, and then removing excess material.

Similarly, such a SiC TFET may be realized by the formation of a metal-semiconductor heterojunction adjacent to a gate oxide. For example, a high work function, such as tungsten may be placed in a recess of a SiC wafer using CVD. Other high work function metals such as platinum, titanium, nickel, tantalum, and gold may also be used, for example, as well as alloys containing tungsten, platinum, titanium, nickel, tantalum, or gold. Metals with higher work functions may produce better junctions, e.g., metals with a work function of 3.7 eV or higher. However, any metal or alloy with a work function of 3 eV, for example, may be used.

FIG. 1 shows a vertical cross section 100 of an active cell of a planar-gate, vertical, tunneling field-effect transistor (TFET). The TFET may be an n-type or p-type device. For purposes of illustration, the TFET is described herein as a n-type device, with an n+ heavily-doped substrate drain 101. The substrate drain 101 may be made of a WBG material such as silicon carbide. Silicon carbide, gallium nitride, gallium oxide, diamond and other WBG semiconductors of practical interest for the TFET devices described in this disclosure typically have bandgap energy greater than 2 electron Volts (eV) The substrate drain 101 is in contact with a back-side drain contact 150. A voltage-blocking drift region 102 is on top of the substrate 101. The drift region 102 may be made of a WBG material such as SiC and formed via epitaxy, for example. The drift 102 is lightly n-type doped, e.g., in the range of 1e13 to 5e16 $cm^{-3}$. A p-type doped current blocking region 103 is on top of a portion of the drift 102. The blocking region may be formed in the drift region material by, for example, ion-implantation.

A source region 104 is on top of the blocking region 103. The source region 104 may be formed, for example, by recess etching and backfill with a heterogeneous semiconductor material, such as silicon, which is then crystallized or partially crystallized using a laser. The source region 104 can be p-type doped like the p-base in a regular MOSFET, but can also be intrinsic (undoped) or n-type doped. This choice of doping type and level is made according to the desired threshold voltage. If low threshold voltage is needed, for example, the source region 104 may be left undoped (intrinsic) or have n-type doping. Where a higher threshold voltage is needed, p-type doping may be used.

An n+ heavily doped region 110 serves as a source ohmic contact. Like the source region 104, the source region 110 may be created using a low band gap semiconductor material such as silicon. The source 110 may be formed via ion implantation of a portion of source region 104 material. The source contact 110 is connected to a source electrode 107. The source electrode may, for example, be made of a heavily doped material or metal.

In the example of FIG. 1, the electrode 107 is also in contact with the blocking region 103. However, it is not necessary for the electrode 107 to be in contact with the blocking 103 region throughout the active cell. For example, there is no conduction path through the blocking section 103 during first-quadrant forward conduction of the cell. Therefore it is possible that there will be places where source electrode 107 is not in contact with region 103, e.g., by a via cut through the source contact 110 and/or the source region 104.

At forward bias, an electron-tunneling channel is formed along section AA', from the source contact 110 through the source region 104 and into the drift 102, where the drift extends upward past the blocking region 103 to the left of the source region 104. Above this junction region AA' is a gate dielectric region 105, which, for example, may be an oxide layer. Above the gate dielectric 105 is a gate electrode 106 which, for example, may be made of a heavily-doped polysilicon or metal. Above the gate electrode 106 is an inter-layer dielectric (ILD) 108, such as an oxide. ILD 108 isolates, for example, the gate electrode 106 from the source dielectric 107.

In operation at forward bias, the barrier between 102 and 104 is lowered, allowing electrons to tunnel through the source region 104 to the drift 102. When the source region 104 is intrinsic or n-type doped, the gate voltage just needs to be high enough to overcome the heterojunction barrier between the drift 102 and the source region 104. When the source region 104 is p-type doped, the gate bias has to be higher in order to generate an inversion layer with free electrons at the interface of the source region 104 and the gate oxide 105.

By placing the source region 104 in a recess, and filling the recess to the level of the surrounding substrate material, a level surface may be achieved above the junction. This in turn allows the use of a substantially flat, planar gate electrode, as opposed to a gate electrode having an angle in the vicinity of the channel. An angled gate electrode may result in a high electric field at the channel and exhibit a high leakage current.

Figure 2:
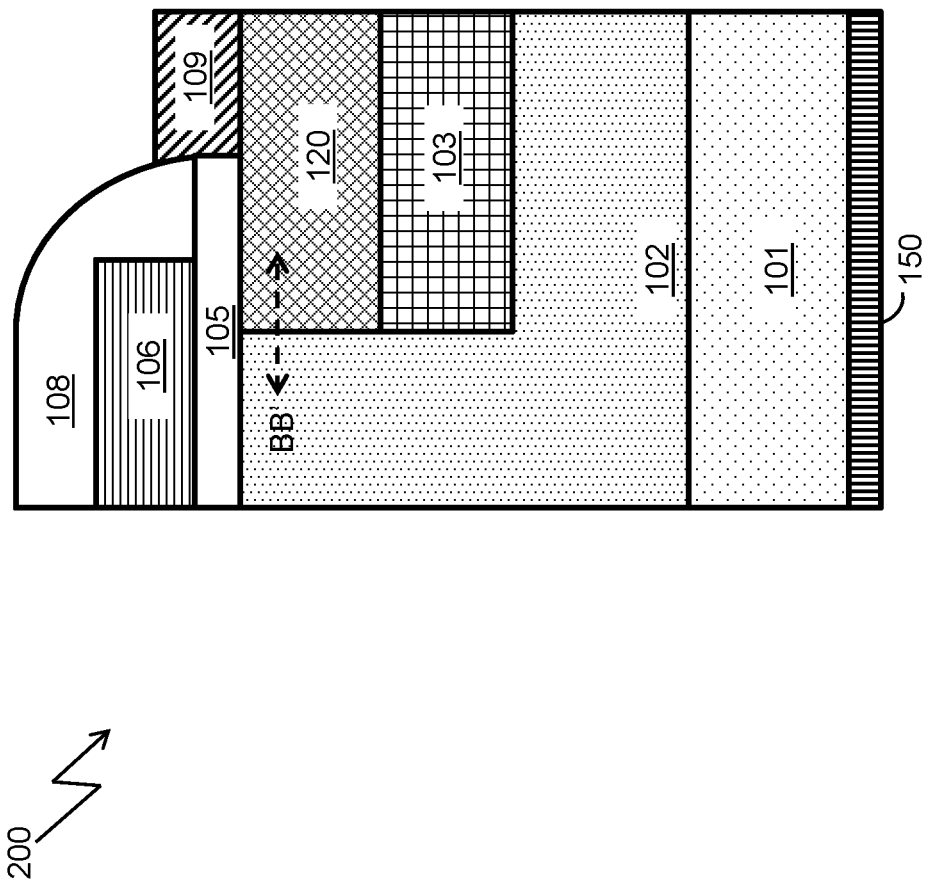
FIG. 2 is vertical cross section of an example lateral planar gate TFET using a high work function metal to high band gap semiconductor heterojunction.

FIG. 2 shows a vertical cross section 200 of an alternative planar-gate TFET which is similar to the TFET of FIG. 1. Here again, the device may be a p-type or n-type device, but for illustration purposes is described as an n-type device. As in FIG. 1, here in again in FIG. 2 an n-type substrate 101 is in contact with a backside drain contact 150. A voltage blocking drift n-type region 102 is on top of the substrate 101, and a current blocking p-type region 103 is on top of a portion of the drift 102.

In contrast to FIG. 1, here in FIG. 2, on top of the current blocking region 103 is a metal source region 120. Source region 120 may be formed by recess-etching and backfill with a high work-function metal, such as tungsten, titanium, or an alloy thereof, for example. Here a source electrode 109 is in contact with metal region 104, but not in direct contact with the current blocking region 103.

At forward bias, an electron-tunneling channel is formed at junction BB'. As in FIG. 1, here in FIG. 2, above the junction BB' is a gate dielectric region 105, and above the gate dielectric is a gate electrode region 106. Above the gate electrode 106 is an ILD 106. The semiconductor materials and oxides in the examples of FIG. 1 and FIG. 2 are similar. The only difference is use of a metallic source structure in FIG. 2, such that the gated tunneling occurs at a metal-semiconductor junction, junction BB'.

Figure 3:
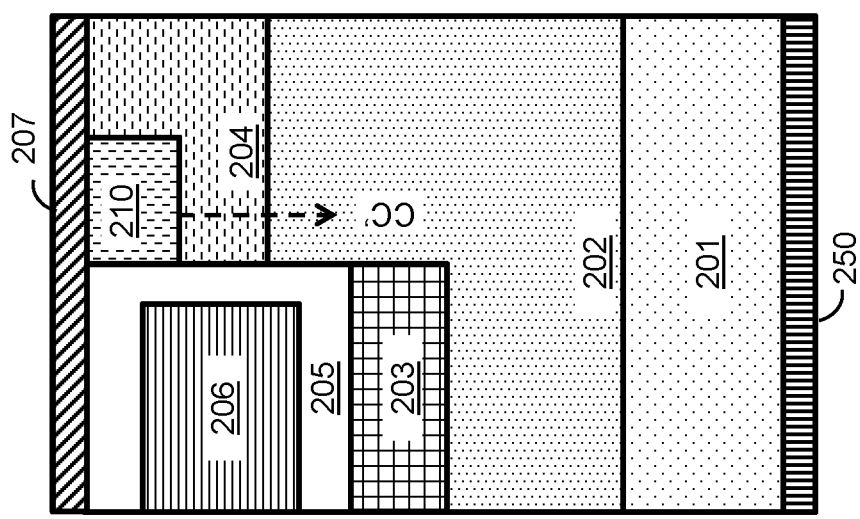
FIG. 3 is vertical cross section of an example vertical planar gate TFET using a trench low band gap to high band gap semiconductor heterojunction.

FIG. 3 shows a vertical cross section 300 of an active cell of an alternative TFET. The materials are as described in reference to FIG. 1, and the semiconductor structures are analogous. Again, for purposes of illustration, the device is described as an n-type device, but could equally be a p-type device. As in FIG. 1, here in FIG. 3 an n-type substrate drain 201 is in contact with a backside drain contact 250. A voltage blocking n-type drift region 202 is on top of the substrate 201. A current blocking p-doped region 203 is above a portion of the drift 202. Here the TFET is a trench device, and the gate electrode 206 is above current blocking region 203. The gate electrode is isolated from a source region 204 by a gate dielectric 205. The same gate dielectric 205 is shown as isolating the gate from the current blocking region 203 and a source electrode 207. However, a thicker dielectric may be used, e.g., between the gate electrode 206 and the source electrode 207 and or blocking region 203. The blocking region 203 may be formed, for example, by ion-implantation of a portion of the drift material. A source region 404 is on top of drift region 202. As described with reference to the source region 104 of FIG. 1, the source region 404 of FIG. 2 is made of a semiconductor such as silicon, which for example may be deposited in heterogeneous form, and may be p-type, n-type, or intrinsic (undoped.) A heavily n-type doped source contact region 210 connects the source region 404 to the source electrode 207. In operation, at forward bias an electron-tunneling channel is formed vertically along junction CC'.

Figure 4:
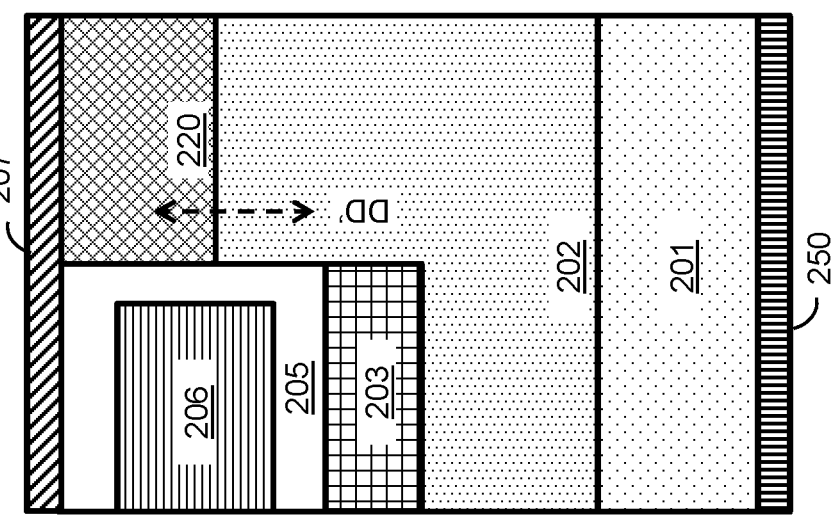
FIG. 4 is vertical cross section of an example vertical planar gate TFET using a trench high work function metal to high band gap semiconductor heterojunction.

FIG. 4 shows a vertical cross section 300 of another TFET. In the example of FIG. 4, the device uses a metal source region 220, like the device described in reference to FIG. 2, but it is a trench device like the device described in reference to FIG. 3. The materials and structures are like those in FIG. 2, but are arranged somewhat differently. Again, the device could be a p-type or an n-type device. For purposes of illustration, here it is described as an n-type device. An n-type substrate 201 is in contact with the drain contact 250. A voltage blocking n-type drift region 202 is on top of the substrate 201. A current blocking p-type region 203 is above a portion of the drift 202. Above a different portion of the drift is a source region 220 made of a of a high work-function metal, such as tungsten, titanium, or an alloy thereof. A source electrode 207 is in contact with the source region 204. Above the blocking region 203 is gate electrode 206 surrounded by a gate dielectric 205. In operation, at forward bias an electron-tunneling channel is formed vertically at junction DD'.

Figure 5:
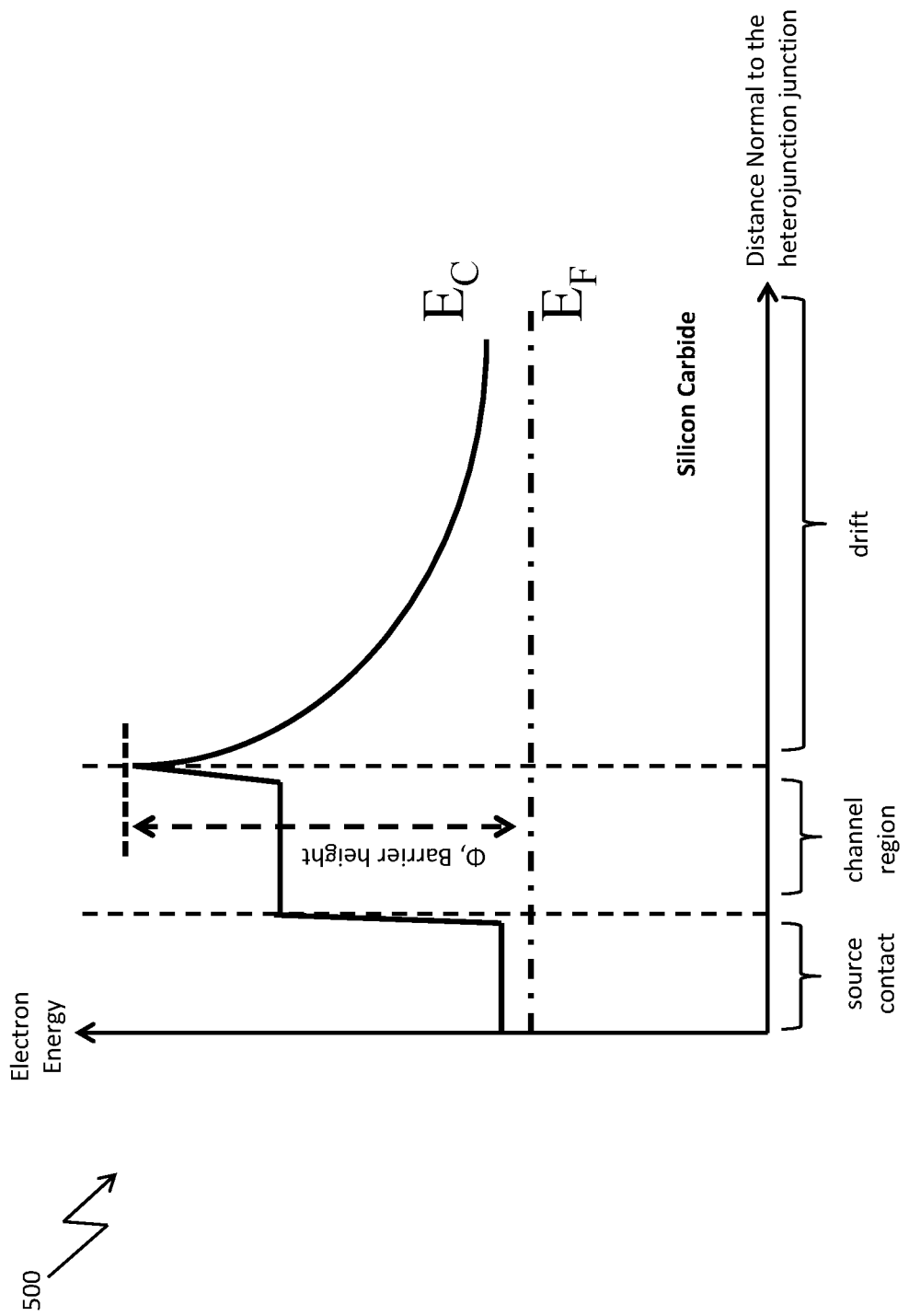
FIG. 5 is an example band diagram at zero gate bias for TFETs using a low band gap to high band gap semiconductor heterojunction, such as the TFETs depicted in FIGS. 1 and 3.

FIG. 5 shows an example graph 500 of band energy at zero gate bias across the active junctions AA' and CC' of the devices shown in FIGS. 1 and 3 respectively. The band offsets between the source contact regions 110 and 210, source regions 104 and 204, and the drift regions 102 and 202 create electron barrier heights Φ (phi) which may be more than 0.5 eV.

Figure 6:
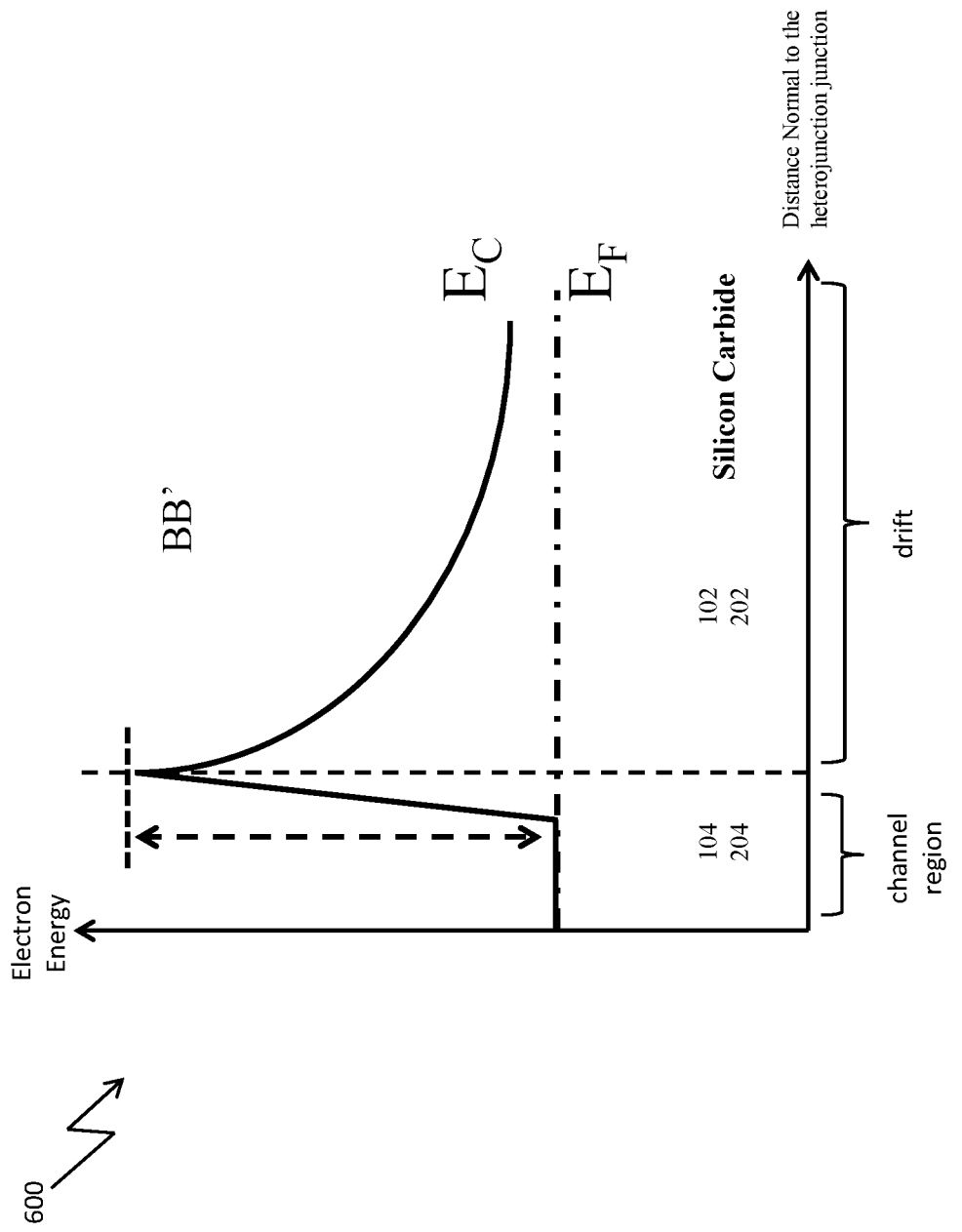
FIG. 6 is an example band diagram at zero gate bias for TFETs using a high work function metal to high band gap semiconductor heterojunction, such as the TFETs depicted in FIGS. 2 and 4.

FIG. 6 shows an example graph 600 of band energy at zero gate bias across the active junctions BB' and DD' of the devices shown in FIGS. 2 and 4 respectively. The band offsets between the high work function material regions 120 and 220 and the drift regions 102 and 202 create electron barrier heights Φ (phi) which may be more than 0.5 eV.

Figure 7:
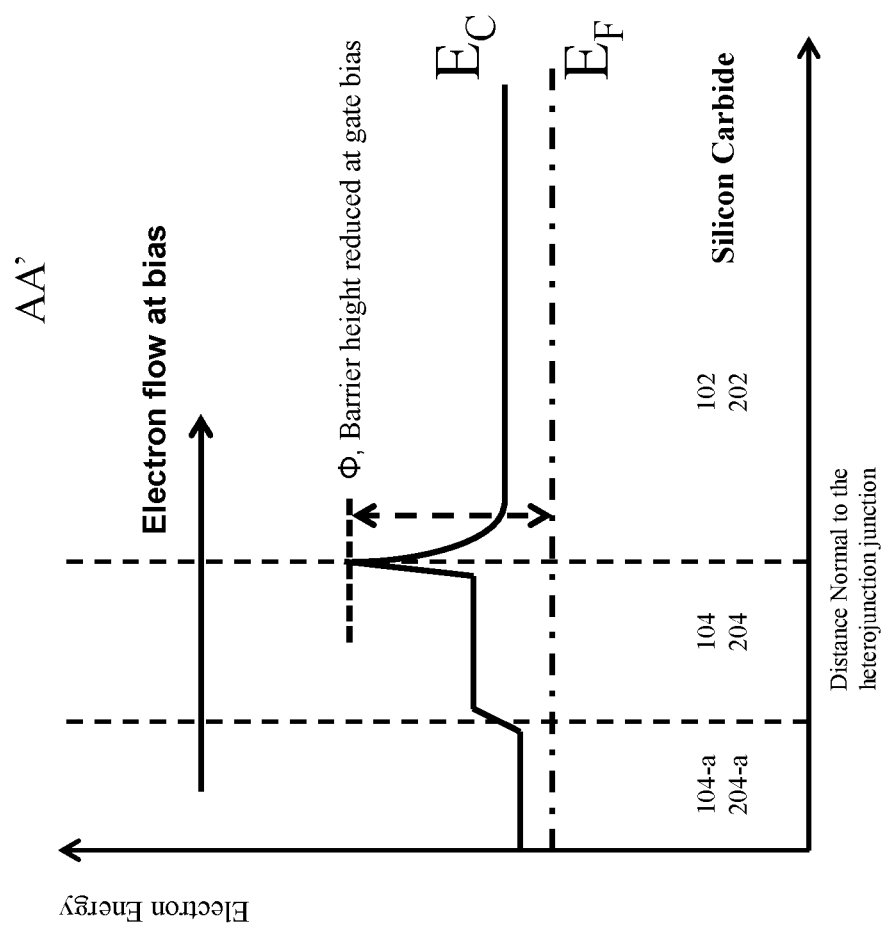
FIG. 7 is an example band diagram at non-zero gate bias for TFETs using a low band gap to high band gap semiconductor heterojunction, such as the TFETs depicted in FIGS. 1 and 3.

FIG. 7 shows an example graph 700 of band energy at positive gate bias across junction AA' and CC' of the devices shown in FIGS. 1 and 3 respectively. Here, with positive gate bias, the electron barrier heights Φ are reduced. This allows electrons to flow from source region 104 to drift 102 in the case of the device of FIG. 1, and from source region 404 to drift 202 in the case of the device of FIG. 3.

Figure 8:
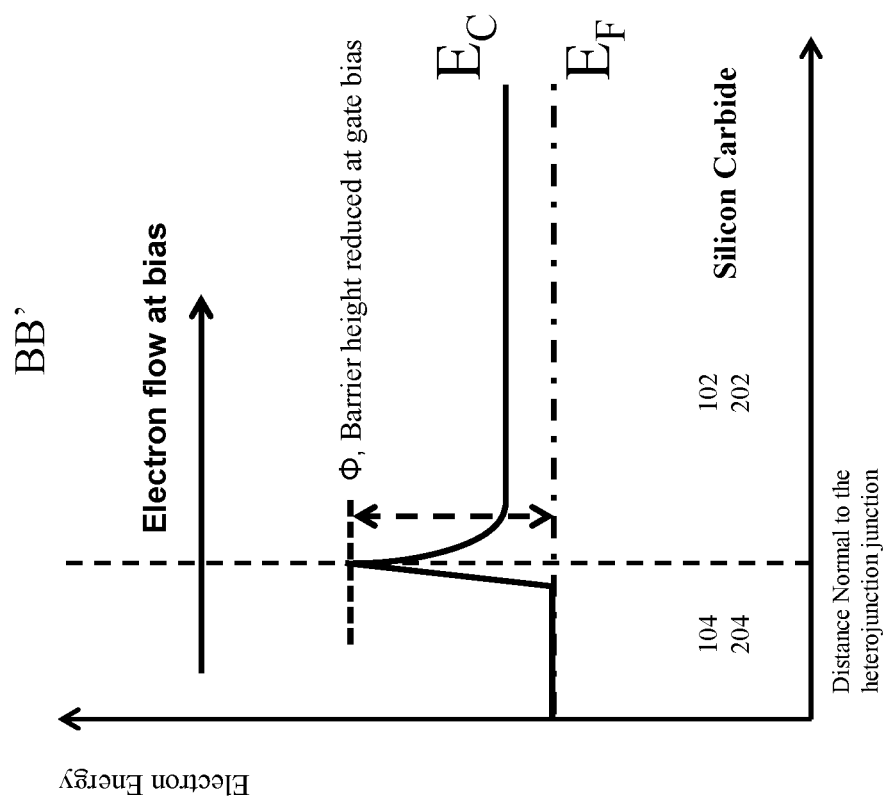
FIG. 8 is an example band diagram at non-zero gate bias for TFETs using a high work function metal to high band gap semiconductor heterojunction, such as the TFETs depicted in FIGS. 2 and 4.

FIG. 8 shows an example graph 800 of band energy at positive gate bias across junction BB' and DD' of the devices shown in FIGS. 2 and 4 respectively. Here, with positive gate bias, the electron barrier heights Φ are reduced. This allows electrons to flow from high work function material 120 to drift 102 in the case of the device of FIG. 2, and from high work function material 220 to drift 202 in the case of the device of FIG. 4.

FIGS. 9 through 20 show sequential vertical cross sections of a TFET active cell at various stages of manufacture to illustrate an exemplary process for manufacturing a TFET like the TFETs show in FIGS. 1-4. The process is described in terms of a n-type silicon carbide-based device of the kind shown FIG. 1. It will be appreciate that similar processes can be used to form either semiconductor to semiconductor junction devices or metal to semiconductor junction devices, as well as both trench and non-trench devices, n-type and p-type devices, and devices using various semiconductors.

FIG. 9 shows a cross section 900 of a starting material for the process, e.g., a wafer, consisting of a heavily n-type doped substrate 101 and a lighter n-type doped epitaxial drift layer 102 on top of the substrate 101.

FIG. 10 shows a cross section 1000 of a portion of the starting material that will become an active cell, where a recess is formed in the drift layer 102, e.g. via a photo masking followed by and chemical or plasma etching.

Figure 11:
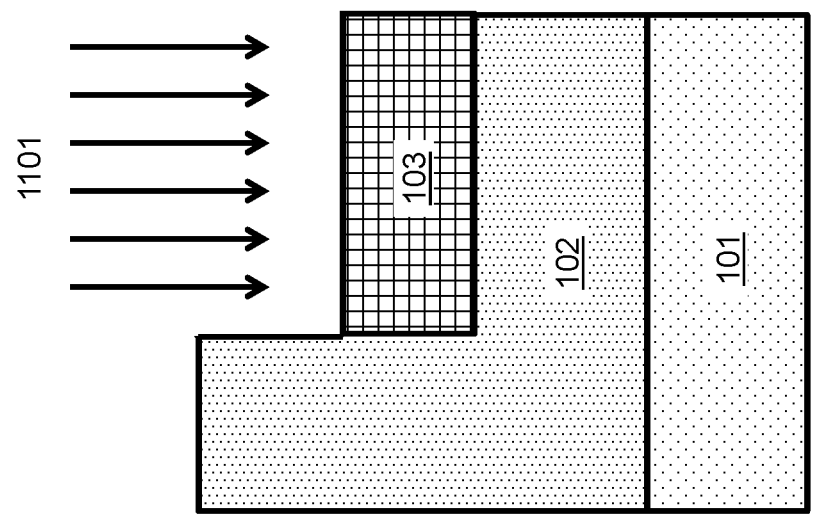

FIG. 11 shows a cross section 1100 being treated with a p-type ion implant 1101 to forms p-type region 103 at the bottom of the recess.

Figure 12:
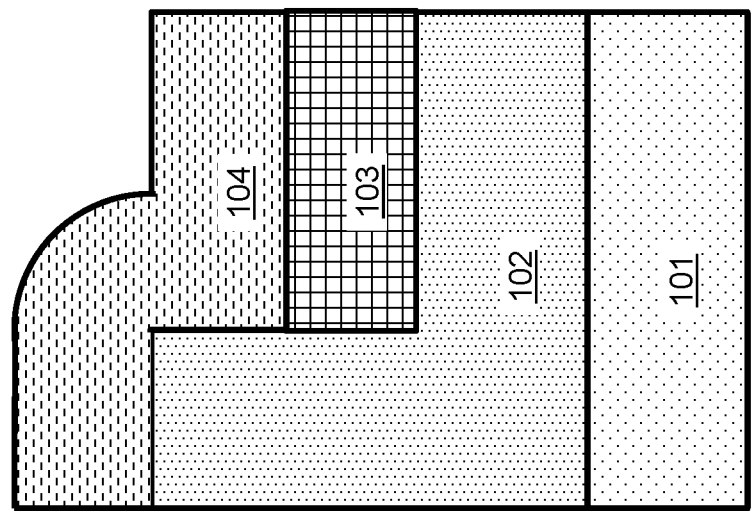

FIG. 12 shows a cross section 1200 where a low band gap semiconductor 104, e.g. silicon, is deposited.

Figure 13:
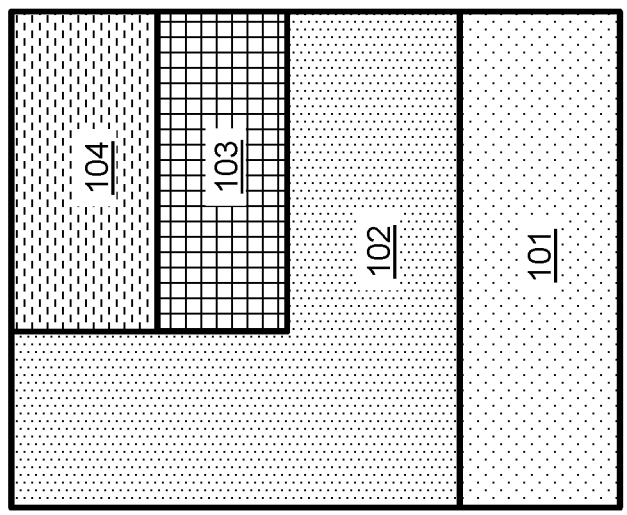

FIG. 13 shows a cross section 1300 where the wafer is and planarized, e.g., smoothed using processes like chemical-mechanical-planarization (CMP), or by etching with an inversion mask of the one used to create the recess.

Figure 14:
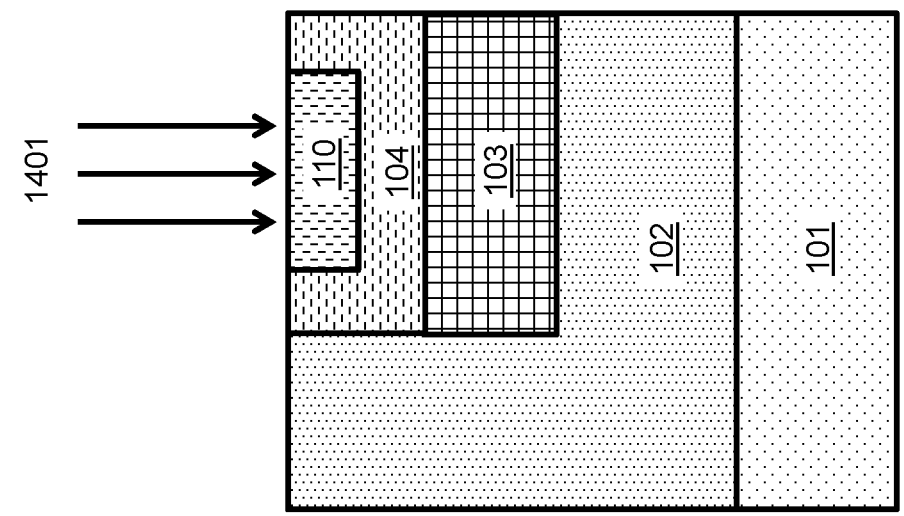

FIG. 14 shows a cross section 1400 in which a heavily n-type doped source contact region 110 is being formed by ion implant 1401.

Figure 15:
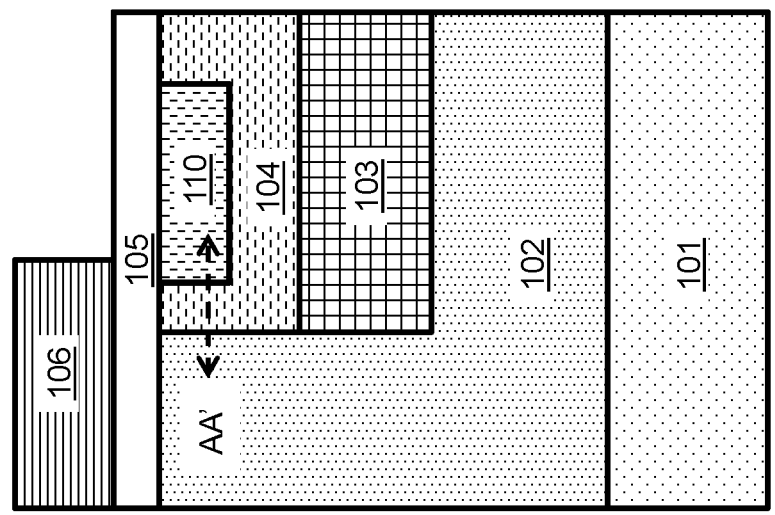

FIG. 15 shows a cross section 1500 including a gate dielectric 105, e.g., an oxide, extending over the heterojunction AA' between the source contact 110, the source region 104, and the drift region 101. The gate dielectric 105 may be formed by deposition, thermal growth, or a combination of the two, for example. Above the gate dielectric 105 in the vicinity of the junction is the gate electrode 106, which may be made by of heavily-doped polysilicon or metal.

Figure 16:
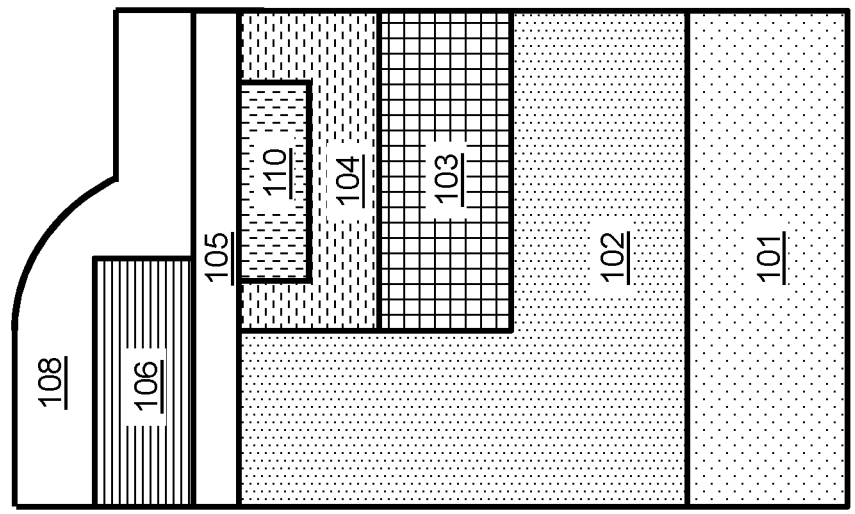

FIG. 16 shows a cross section 1600 including an interlayer dielectric (ILD) 108, which may be a deposited oxide, for example.

Figure 17:
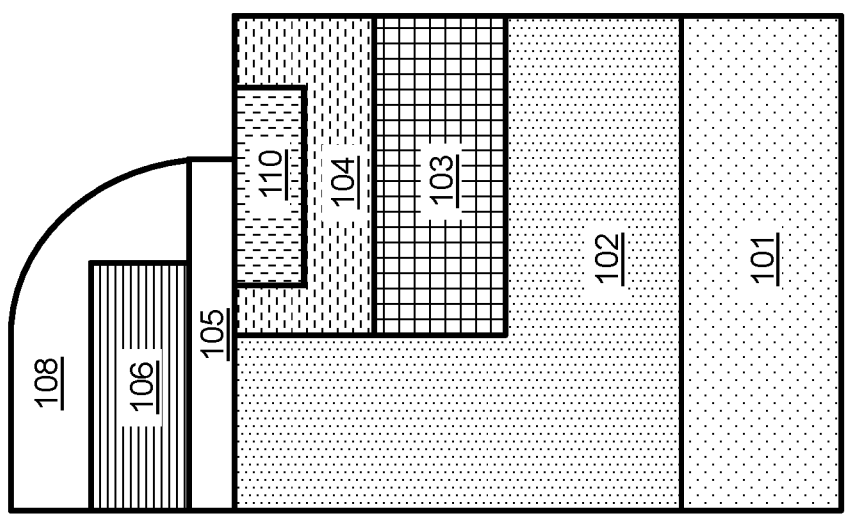

FIG. 17 shows a cross section 1700 where a portion of the ILD 108 and gate oxide 105 have been etched back to expose portions of the source contact 110 and source region 104.

FIG. 18 shows a cross section 1800 where a portion of the source contact 110 and source region 104 is etched back to further expose a portion of the p-type region 103.

Figure 19:
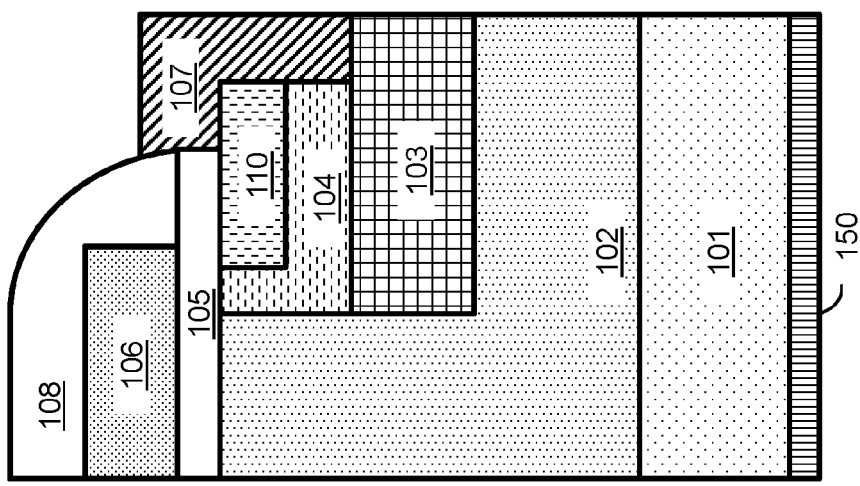

FIG. 19 shows a cross section 1900 where a source electrode 107 connects to the source contact 110 and to the p-type region 103. The extension of the source electrode 107 down to the p-type region 103 may be achieved by etching a via. This has the advantage of making the connection using conventional metallization steps, e.g., without via filling. The use of such a via is optional in any given active cell area. That is, the potential of the source electrode 107 can be connected to the p-type-region by other means. For example, the connection may be made in alternating active cell regions.

Not shown in FIG. 19, a separate opening is made in ILD 108, e.g., by etching, so that gate electrode 106 can be reached in metallization steps.

FIG. 19 also shows a backside drain connection which may be formed, e.g., after the completion of other wafer processes by way of etching and metallization and/or laser treatment.

FIG. 20 shows a cross section 2000 that is similar to cross section 1900 of FIG. 19. Here in FIG. 20, a source electrode 109 connects only to the source contact 110. There is no via connection between the source contact 109 to the p-type region 103 in this cross section 2000 of the active cell.

Figure 21:
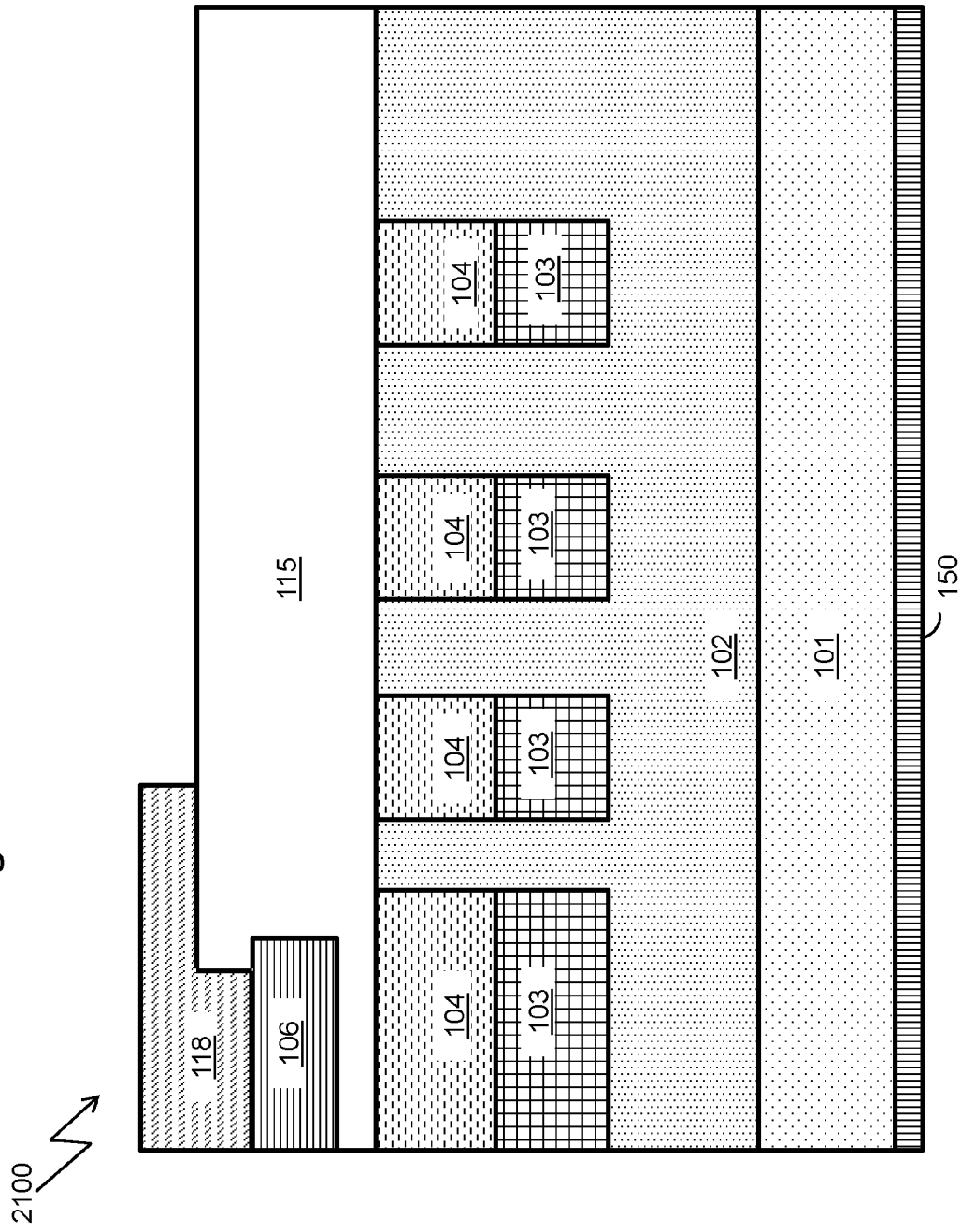
FIGS. 21, 22, and 23 show vertical cross sections of example edge termination structures that may be used with TFET active cell structures such as those shown in FIGS. 1-4.
Figure 22:
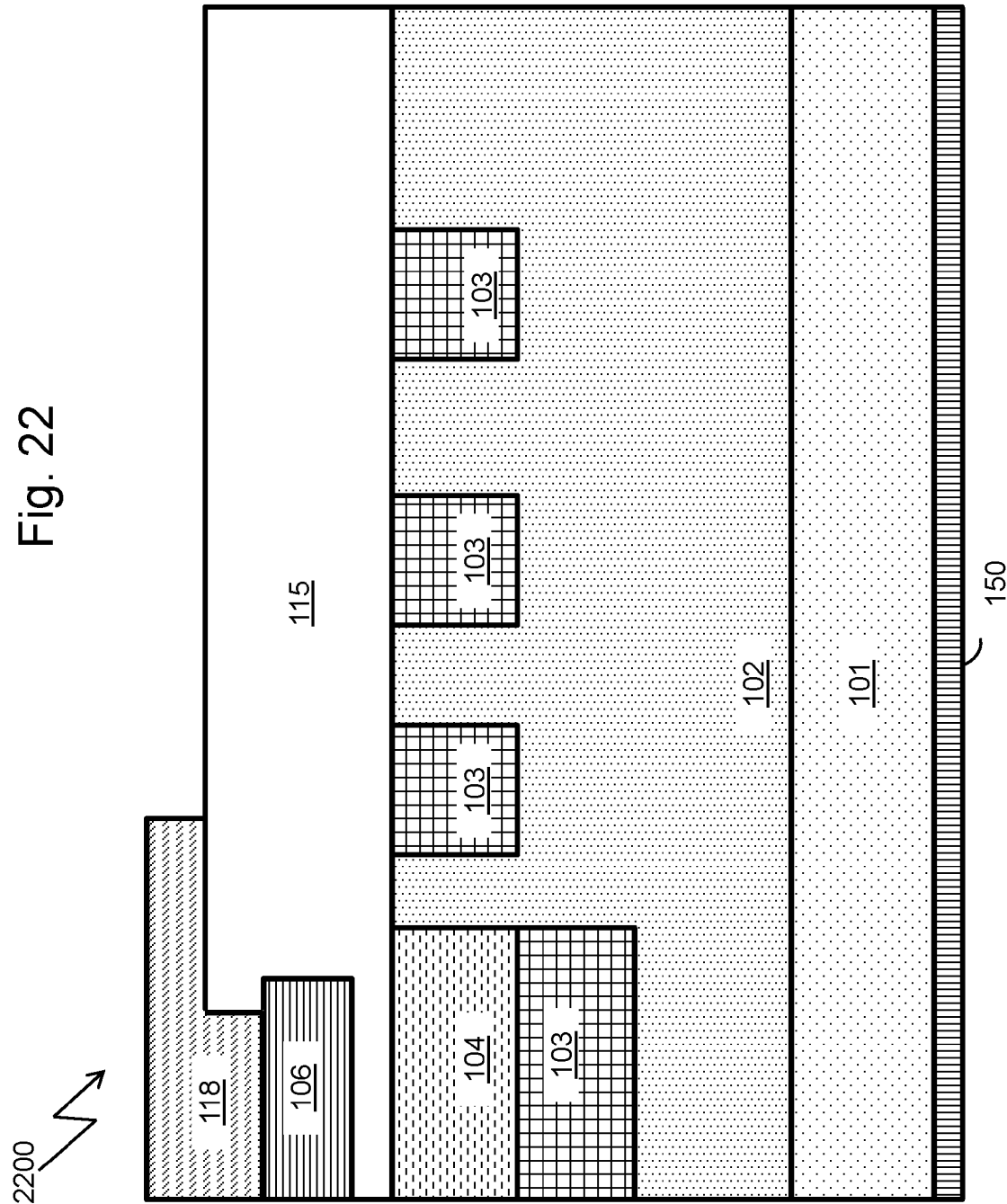
Figure 23:
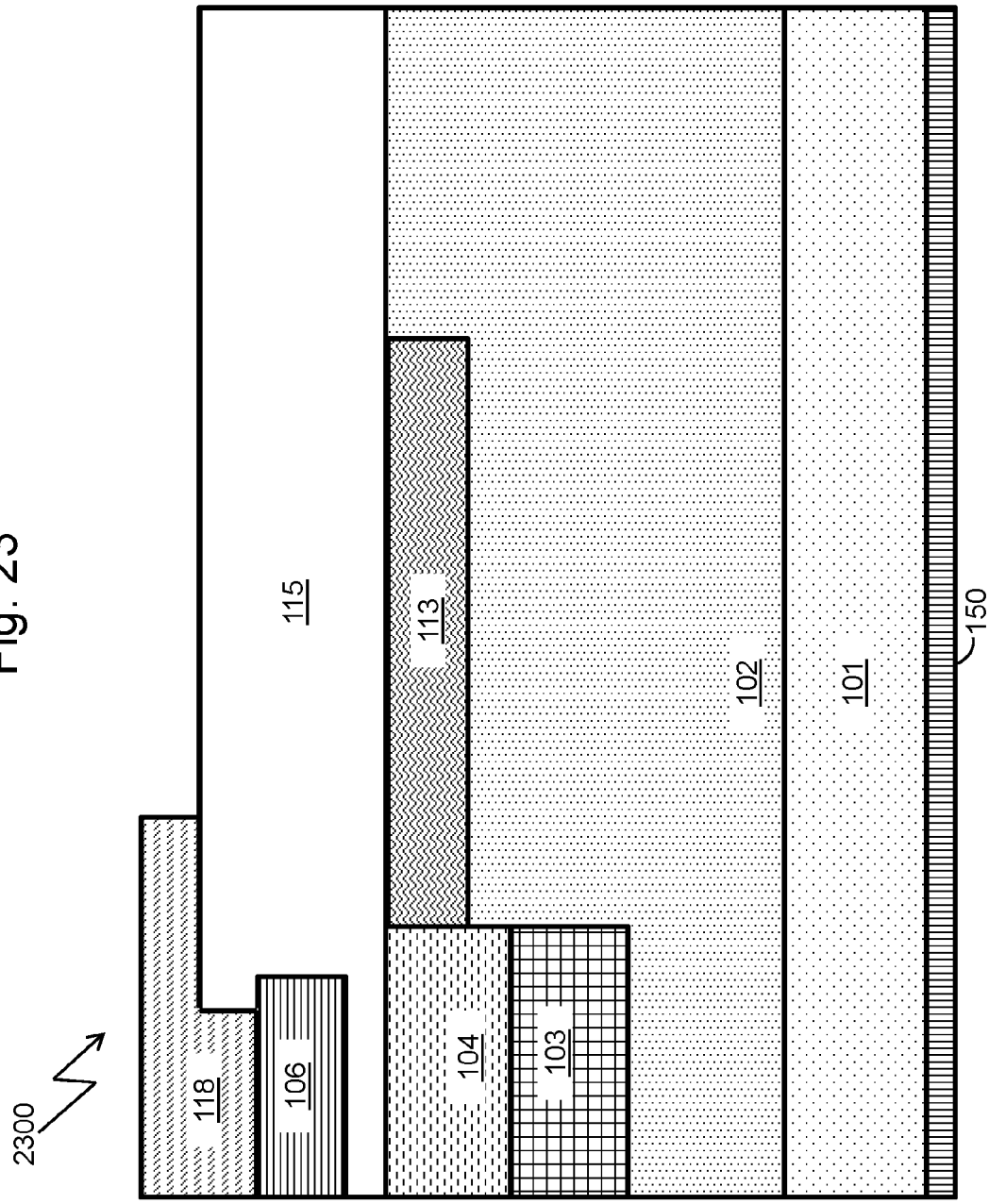

FIGS. 21, 22, and 23 illustrate options for implementing of gate buss bars and edge terminations for the TFET devices described herein.

FIG. 21 shows a first example cross section 2100 of a termination region of a device. In the example of FIG. 21, both p-type regions 103 and source region 104 regions are applied at edge termination region and forms guard rings. The p-type regions 103 may be formed at the same time as the corresponding regions in the active cells via implantation of portions of the drift 102 as described in reference to FIG. 11. The source regions 104 may be formed at the same time as the corresponding regions in the active cells, e.g., via the deposition of a heterogeneous semiconductor such as silicon and subsequent treatment thereof. Region 118 is a metal layer that is in contact with gate electrode 106. A dielectric layer 115 extends over the termination region. Drift region 102, substrate 101, and drain contact 150 are the same as described, e.g., in connection with the active cells cross sections 100 and 200 of FIGS. 1 and 2.

FIG. 22 shows a second example cross section 2200 of a termination region of a device. In the example of FIG. 22, only p-type regions 103 are used as guard rings in the edge termination region of device.

FIG. 23 shows a third example cross section 2300 of a termination region of a device. In the example of FIG. 23, a second p-type implantation region 113 is used to form an edge termination known as Junction-Termination-Extension (JTE). The JTE 113 may be connected to the source material 104, as depicted in FIG. 23. Alternatively, the JTE may be placed with an edge close to the source material, e.g., within 5 um.

Figure 24:
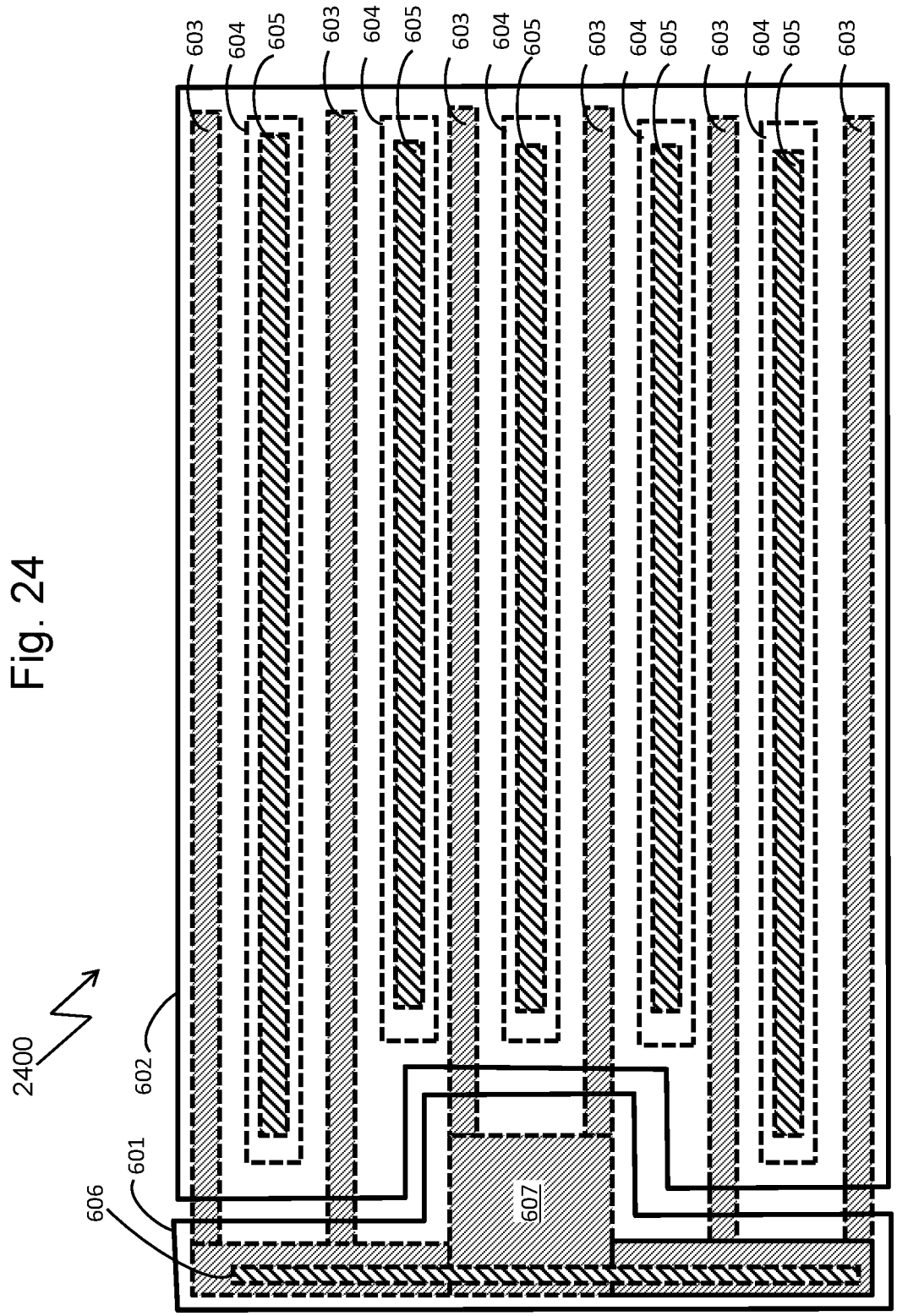
FIG. 24 is a top view of a die including both active cell and edge termination and active cell regions.

FIG. 24 shows a top view 2400 of an example layout of a device die. Gate electrode lines 603 are formed using a conductive material such as a heavily-doped polysilicon or a thin metal. The gate electrodes 603 are connected at the left edge of the die, and a via 606 is used to connect gate electrode 603 material to a top gate metal region 601 which serves as the gate buss. The gate-connected top metal region 601 has a large bonding pad 607 where a gate bond wire may be attached to the die. The source regions 604 are connected to a source top metal region 602 through openings in the top dielectric 605.

It will be appreciated that the layout shown in FIG. 24 is just one of many possible configurations. Many design variations are possible, for example, to arrange gate electrode lines and top metals to distribute the gate and source currents uniformly.

Figure 25:
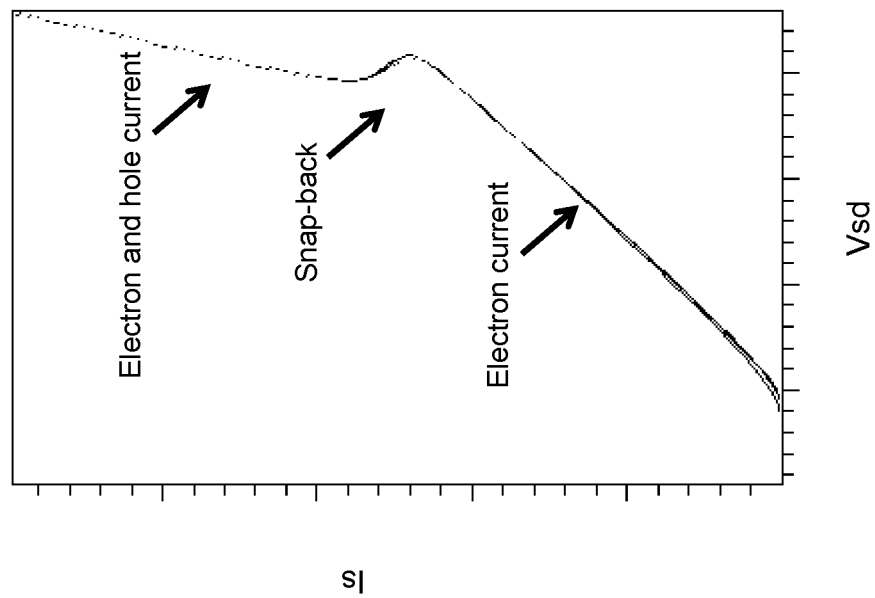
FIGS. 25 and 26 show example curves of source current versus source to drain voltages for various implementations of the TFETs shown in FIGS. 1-4.

FIG. 25 shows an example curve of source current (Is) versus source-to-drain voltage (Vsd) for TFET devices such as those shown in FIGS. 1-4. The lower part of the curve has only electron current, which results in a small reverse recovery charge, Qrr, thus reducing circuit loss during turn-on transient. The upper part of this curve with higher slope is bipolar current that has both electron current and hole current, such as a surge current occurring during circuit start-up. Depending on design considerations such as pitch-size, and on operating conditions such as temperature, the Is-Vsd curve may or may not show a snap-back. The snap-back is a result of conductivity modulation near the junction between the p-type implanted region and the drift region. FIG. 25 indicates a snap-back.

Figure 26:
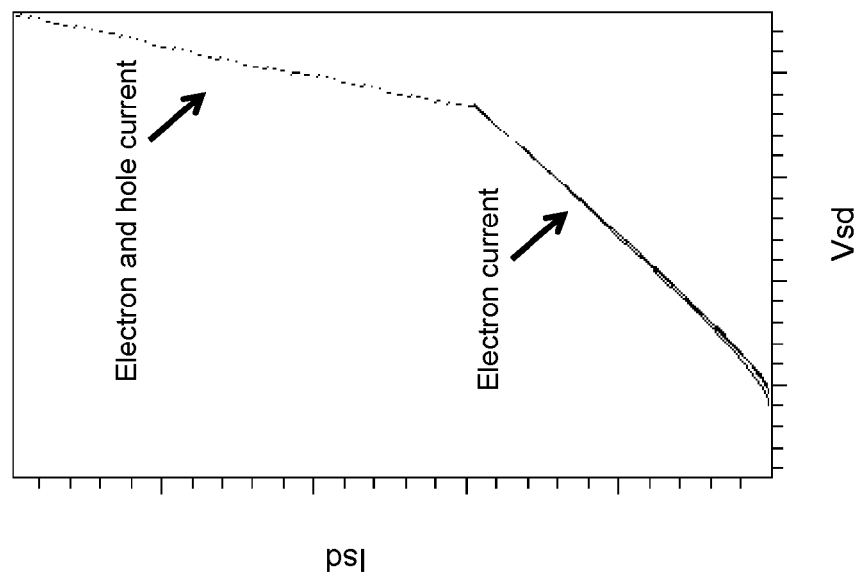

FIG. 26 another example curve of Is versus Vsd for TFET devices such as those shown in FIGS. 1-4. The curve in FIG. 26 is similar to the curve in FIG. 25, however in FIG. 26 there is no snap-back.

Figure 27:
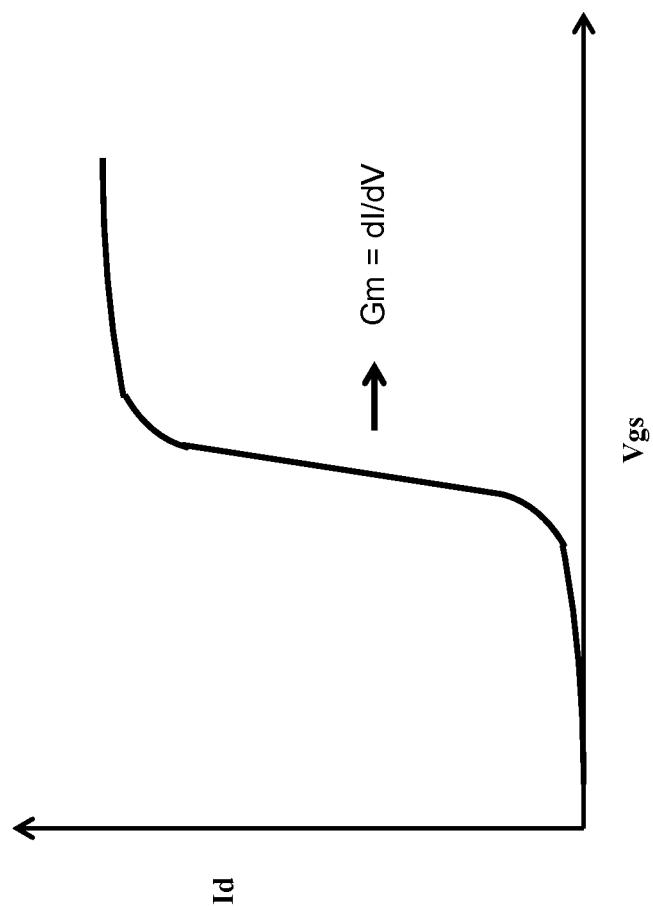
FIG. 27 shows an example curve of drain current versus gate-to-source voltage for various implementations of the TFETs shown in FIGS. 1-4

FIG. 27 shows an example curve drain current (Id) versus gate-to-source voltage (Vgs) for TFET devices such as those shown in FIGS. 1-4. The threshold is determined by the barrier height and the gate dielectric thickness, and can be well controlled. The channel resistance will be small due to lack of p-type silicon carbide in the source region. Thus, the transconductance, Gm, of this invention may be higher than the transconductance of a conventional SiC MOSFET, resulting in shorter current rise and fall times during switching.

The TFETs described herein may be used to create a variety of power electronic circuits, such as power factor correction (PFC) circuits, DC-DC converters, DC-AC inverters, and motor drives.

The options for TFET construction described herein may be used in any combination. For example, substrates may be made of any wide bandgap material, such as, but not limited to, silicon carbide, gallium nitride, diamond, or gallium oxide, and may have a bandgap above or below 2.0 eV, for example. In many instances, a bandgap of 2.2 eV or higher may be desirable. The drift and drain structures may be formed in this substrate material, e.g., via doping to different concentrations.

A metal or a narrow bandgap semiconductor may be used as the non-wide-bandgap material for the source region. Silicon may be used as the narrow bandgap material. The narrow bandgap material may be added to the structure in crystalline or heterogeneous form. If the narrow bandgap material is added in heterogeneous form, it may be treated, e.g., by heating, to anneal into crystalline or semi-crystalline form. The metal may be, but is not limited to, tungsten, nickel, gold, or titanium. The metal may have a work function above or below 3.0 eV. In many instances, a work function of 3.7 eV or higher may be desirable.

The gate of a TFET made in accordance with this disclosure may be arranged in any orientation. For example, the gate may be substantially parallel to the plane of the substrate, perpendicular to the plane of the substrate, or some combination of the two. For example, multiple gates may be used. The gate may optionally include an oxide or other dielectric layer.

A TFET made in accordance with this disclosure will generally include a blocking region. The blocking region may be constructed via doping of a portion of the substrate, e.g., with a doping type opposite that of the drift and drain. Optionally, the blocking region may be formed, e.g., by filling a trench. Alternatively the blocking region may be formed connected to a crystalline source component, and added to the substrate with the crystalline source.

In describing embodiments of the subject matter of the present disclosure, as illustrated in the figures, specific terminology is employed for the sake of clarity. The claimed subject matter, however, is not intended to be limited to the specific terminology so selected, and it is to be understood that each specific element includes all technical equivalents that operate in a similar manner to accomplish a similar purpose.

This written description uses examples to disclose the invention, including the best mode, and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal language of the claims.

I claim:

1. A tunneling field-effect transistor, comprising:
   a) a planar substrate, the planar substrate comprising a drain contact region below a drift region, where the drain contact region and the drift region comprise a wide-bandgap semiconductor of a first doping type, wherein the wide-bandgap semiconductor has a bandgap greater than 2.0 eV;
   b) a source region, where a first portion of the source region abuts the drift region at a junction, the source region comprising a narrow band gap semiconductor;
   c) a blocking region, the blocking region being located between a second portion of the source region and the drift region, where the blocking region is of a second doping type, where the second doping type is different from the first doping type;
   d) a source electrode, where the source electrode is connected to the source region and to the blocking region; and
   e) a planar gate at an end of the junction, the gate comprising a gate electrode and a gate dielectric, where the plane of the gate is adjacent to the junction, a portion of the source region, and a portion of the drift region.

2. The tunneling field-effect transistor of claim 1, wherein the wide-bandgap semiconductor has a bandgap greater than or equal to 2.2 eV.

3. The tunneling field-effect transistor of claim 1, wherein the wide-bandgap semiconductor comprises silicon carbide, gallium nitride, diamond, or gallium oxide.

4. The tunneling field-effect transistor of claim 2, wherein the bandgap of the wide-bandgap semiconductor is greater than a bandgap of the narrow bandgap semiconductor by at least 0.4 electron volts.

5. The tunneling field-effect transistor of claim 1, wherein the source region comprises silicon.

6. The tunneling field-effect transistor of claim 2, wherein the source region comprises crystalline silicon.

7. The tunneling field-effect transistor of claim 1, wherein the plane of the gate is substantially parallel to the plane of the planar substrate.

8. The tunneling field-effect transistor of claim 1, wherein the plane of the gate is substantially perpendicular to the plane of the planar substrate.

9. A tunneling field-effect transistor, comprising:
   a) a planar substrate, the planar substrate comprising a drain contact region below a drift region, where the drain contact region and the drift region comprise a wide-bandgap semiconductor are of a first doping type, wherein the wide-bandgap semiconductor has a bandgap greater than 2.0 eV;
   b) a source region, where a first portion of the source region abuts the drift region at a junction, the source region comprising a high work function metal;
   c) a blocking region, the blocking region being located between a second portion of the source region and the drift region, where the blocking region is of a second doping type, where the second doping type is different from the first doping type;
   d) a source electrode, where the source electrode is connected to the source region and to the blocking region; and
   e) a planar gate at an end of the junction, the gate comprising a gate electrode and a gate dielectric, where the plane of the gate is adjacent to the junction, a portion of the source region, and a portion of the drift region.

10. The tunneling field-effect transistor of claim 9, wherein the high work function metal has a work function of 3.0 eV or higher.

11. The tunneling field-effect transistor of claim 9, wherein the source region comprises tungsten, nickel, gold, or titanium.

12. The tunneling field-effect transistor of claim 9, wherein the plane of the gate is substantially parallel to the plane of the planar substrate.

13. The tunneling field-effect transistor of claim 9, wherein the plane of the gate is substantially perpendicular to the plane of the planar substrate.

14. The tunneling field-effect transistor of claim 9, wherein the wide-bandgap semiconductor has a bandgap greater than or equal to 2.2 eV.

15. The tunneling field-effect transistor of claim 9, wherein the wide-bandgap semiconductor comprises silicon carbide, gallium nitride, diamond, or gallium oxide.

16. A method of manufacturing a tunneling field-effect transistor, comprising:
   a) etching a notch into an upper portion of a drift region of a planar substrate, the planar substrate comprising a drain contact region below the drift region, where the drain contact region and the drift region comprise a wide-bandgap semiconductor of a first doping type, the wide bandgap semiconductor having a bandgap greater than 2.0 electron volts, where the wide-bandgap semiconductor comprises silicon carbide, gallium nitride, diamond, or gallium oxide;

b) forming a blocking region beneath the notch by implantation of an exposed portion of the drift region, where the blocking region is a of second doping type, where the second doping type is different from the first doping type;

c) filling the notch with a non-wide band gap material to form a source region, where a first portion of the source region abuts the drift region at a junction, the non-wide band gap material is a narrow bandgap semiconductor or a high work function metal;

d) placing a planar gate at an exposed end of the junction, the gate comprising a gate electrode and a gate dielectric, where the plane of the gate extends over the end of the junction, over a portion of the source region, and over a portion of the drift region; and e) connecting a source electrode to the source region and to the blocking region.

17. The method of claim 16, wherein the non-wide band gap material is a high work function metal.

18. The method of claim 16, wherein the non-wide band gap material is silicon.

19. The method of claim 18, further comprising:
   a) depositing the silicon in heterogeneous form;
   b) crystallizing the silicon via laser stimulation.

20. The method of claim 16, further comprising:
   a) exposing the end of junction by etching a trench adjacent to the source region, where the trench abuts the source region and the blocking region;
   b) forming a dielectric on a wall of the trench;
   c) placing the gate electrode adjacent to the dielectric on the wall of the trench.

21. The tunneling field-effect transistor of claim 9, wherein the high work function metal has a work function of 3.7 eV or higher.

* * * * *